(12) United States Patent
Ko et al.

(10) Patent No.: US 7,361,608 B2
(45) Date of Patent: Apr. 22, 2008

(54) METHOD AND SYSTEM FOR FORMING A FEATURE IN A HIGH-K LAYER

(75) Inventors: Akiteru Ko, Peabody, MA (US); Annie Xia, Lynnfield, MA (US); Lee Chen, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 18 days.

(21) Appl. No.: 10/954,104

(22) Filed: Sep. 30, 2004

(65) Prior Publication Data

US 2006/0065938 A1 Mar. 30, 2006

(51) Int. Cl.
*H01L 21/302* (2006.01)
*H01L 21/461* (2006.01)

(52) U.S. Cl. .................. 438/710; 438/240; 438/287; 438/785; 257/21.19

(58) Field of Classification Search ............... 438/240, 438/287, 785, 710; 257/E21.19
See application file for complete search history.

(56) References Cited

U.S. PATENT DOCUMENTS

| | | | |
|---|---|---|---|
| 6,348,420 B1* | 2/2002 | Raaijmakers et al. | 438/769 |
| 6,696,327 B1* | 2/2004 | Brask et al. | 438/197 |
| 6,709,715 B1* | 3/2004 | Lang et al. | 427/489 |
| 6,727,148 B1* | 4/2004 | Setton | 438/287 |
| 6,750,126 B1* | 6/2004 | Visokay et al. | 438/585 |
| 6,787,440 B2* | 9/2004 | Parker et al. | 438/591 |
| 6,787,861 B2* | 9/2004 | Lucovsky et al. | 257/410 |
| 6,806,095 B2* | 10/2004 | Nallan et al. | 438/3 |
| 2001/0031562 A1* | 10/2001 | Raaijmakers et al. | 438/770 |
| 2002/0115252 A1* | 8/2002 | Haukka et al. | 438/240 |
| 2002/0172768 A1* | 11/2002 | Endo et al. | 427/255.28 |
| 2003/0060057 A1* | 3/2003 | Raaijmakers et al. | 438/770 |
| 2004/0043557 A1* | 3/2004 | Haukka et al. | 438/240 |
| 2004/0178169 A1* | 9/2004 | Desphande et al. | 216/12 |
| 2005/0014380 A1* | 1/2005 | Kai et al. | 438/706 |
| 2005/0074978 A1* | 4/2005 | Wang et al. | 438/706 |
| 2005/0106893 A1* | 5/2005 | Wilk | 438/758 |
| 2005/0124109 A1* | 6/2005 | Quevedo-Lopez et al. | 438/240 |
| 2005/0196915 A1* | 9/2005 | Jeong et al. | 438/238 |

(Continued)

OTHER PUBLICATIONS

Nitrogen plasma annealing for low temperature Ta2O5 films, Alers G. B. et al., Applied Physics Letters—Mar. 16, 1998—vol. 72, Issue 11, pp. 1308-1310.*

(Continued)

*Primary Examiner*—George Fourson
*Assistant Examiner*—John M. Parker
(74) *Attorney, Agent, or Firm*—Oblon, Spivak, McClelland, Maier & Neustadt, P.C.

(57) ABSTRACT

A method for plasma processing a high-k layer includes providing a substrate having a high-k layer formed thereon, on a substrate holder in a process chamber, and creating a plasma in the process chamber to thereby expose the high-k layer to the plasma. RF power is applied to the substrate holder, the RF power having a characteristic to reduce a rate of formation of an oxide interface layer located between the substrate and the high-k layer. A device includes a feature etched in a high-k layer. The etch profile of the device can include a reduced bird's beak, and a surface of the substrate in an etched region can be substantially coplanar with a substrate under a non-etched area.

35 Claims, 12 Drawing Sheets

U.S. PATENT DOCUMENTS

| | | |
|---|---|---|
| 2005/0205969 A1* | 9/2005 | Ono et al. .................. 257/645 |
| 2005/0255711 A1* | 11/2005 | Sugawara et al. .......... 438/785 |
| 2005/0274948 A1* | 12/2005 | Tamura et al. ................ 257/59 |
| 2005/0282400 A1* | 12/2005 | Xiao et al. .................. 438/778 |
| 2006/0001071 A1* | 1/2006 | Brask et al. ................ 257/310 |
| 2006/0006522 A1* | 1/2006 | Doczy et al. ............... 257/702 |
| 2006/0032585 A1* | 2/2006 | Kai et al. .............. 156/345.48 |

OTHER PUBLICATIONS

I. Popoya, et al., "Electrostatic Field Enhancement of Al(111) Oxidation", Physical Review Letters, vol. 89, No. 27 Dec. 30, 2002, pp. 276101-1-276101-4.

* cited by examiner

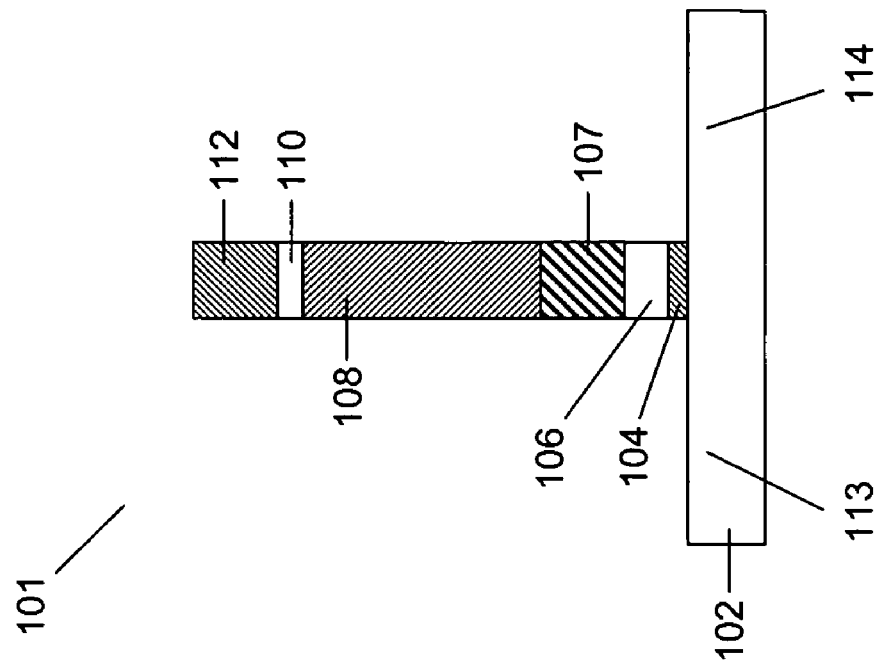
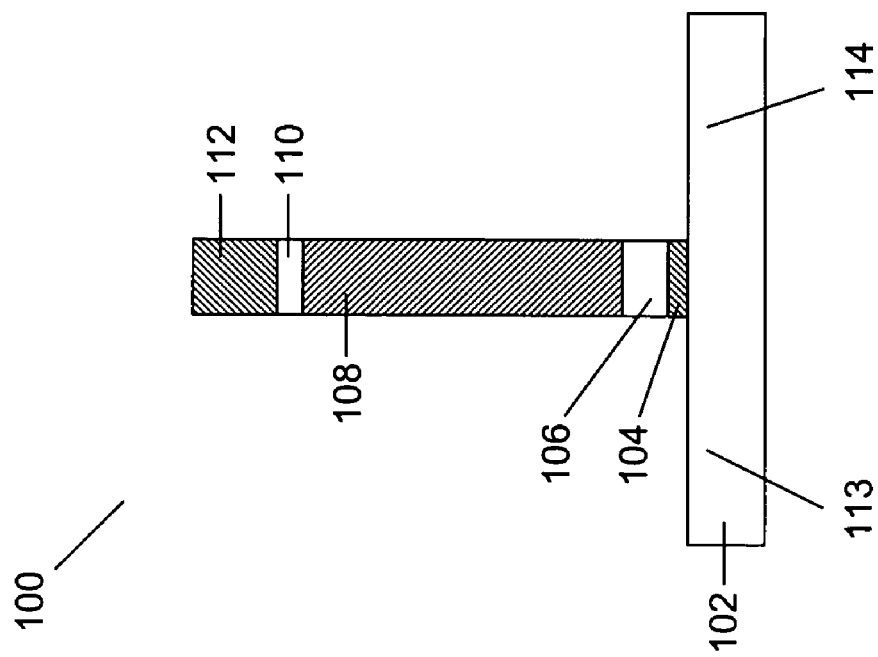

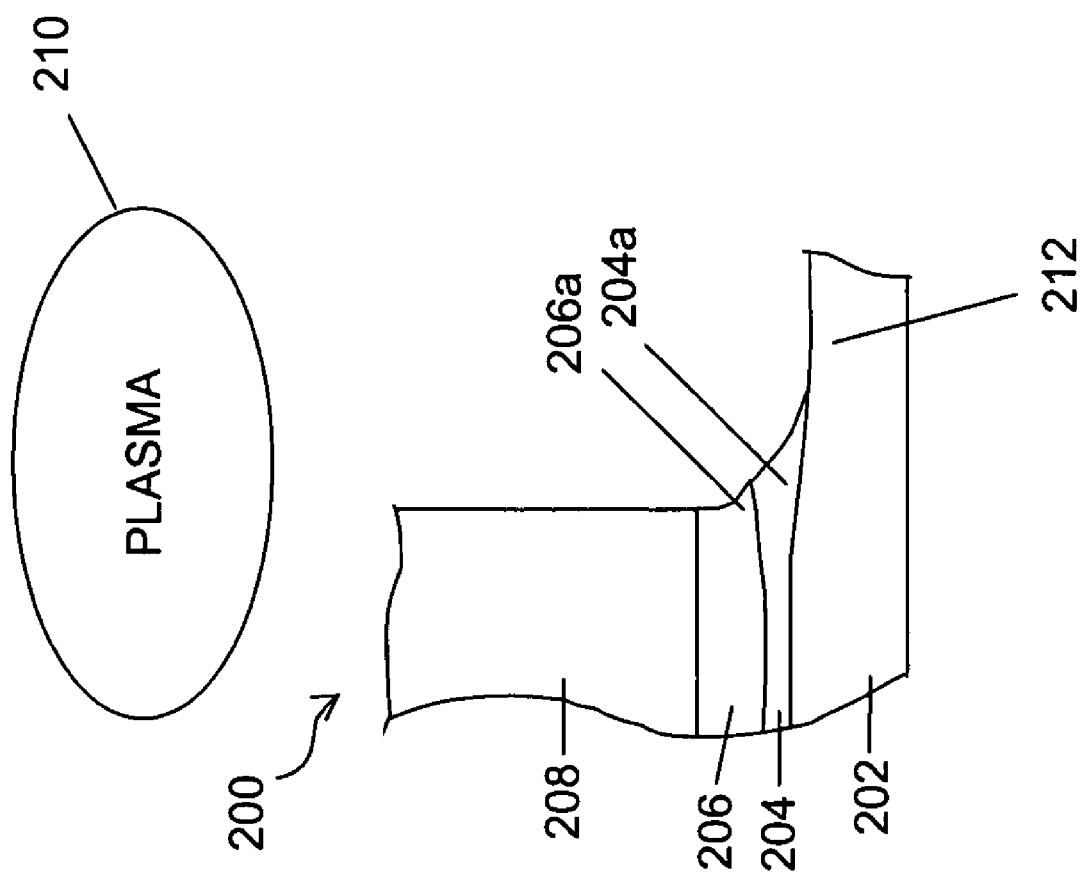

METHOD AND SYSTEM FOR FORMING A FEATURE IN A HIGH-K LAYER

FIELD OF THE INVENTION

The present invention is related to semiconductor processing, and more particularly, to a method and system for forming a feature in a high-k layer formed on a substrate.

BACKGROUND OF THE INVENTION

In the semiconductor industry, the minimum feature sizes of microelectronic devices are approaching the deep sub-micron regime to meet the demand for faster, lower power microprocessors and digital circuits. This trend is leading, for example, to imminent replacement of $SiO_2$ and Si-oxynitride ($SiO_xN_y$) dielectric materials with high-permittivity dielectric materials (also referred to herein as "high-k" materials), and the use of alternative gate electrode materials to replace the traditional doped polycrystalline silicon (poly-Si) in sub-0.1 μm complementary metal-oxide semiconductor (CMOS) technology. Thus, process development and integration issues are key challenges for new gate stack materials and silicide processing.

Dielectric materials featuring a dielectric constant greater than that of $SiO_2$ (k~3.9) are commonly referred to as high-k materials. In addition, high-k materials may refer to dielectric materials that are deposited onto substrates (e.g., $HfO_2$, $ZrO_2$) rather than grown on the surface of the substrate (e.g., $SiO_2$, $SiO_xN_y$). High-k materials may incorporate metallic silicates or oxides, including $Ta_2O_5$ (k~26), $TiO_2$ (k~80), $ZrO_2$ (k~25), $Al_2O_3$ (k~9), $HfSiO_x$ (k~4-25), and $HfO_2$ (k~25).

Integration of high-k materials into gate stacks can require a dielectric interface layer at the substrate surface to preserve interface state characteristics and to form an interface with good electrical properties between the high-k material and the substrate. However, the presence of an oxide interface layer lowers the overall dielectric constant of the gate stack and, therefore, the oxide interface layer may need to be thin. During plasma processing in the manufacturing of gate stacks, high-k layers are frequently removed in source/drain regions of the substrate, in order to allow silicidation of the source/drain regions, and to reduce the risk of metallic impurities being implanted in the substrate during ion implantation. Due to the nature of high-k materials, aggressive etch processes may be needed to remove the high-k material. These aggressive etch processes, however, can lead to removal of the substrate material itself, which can result in poor device characteristics. Thus, industry efforts have been directed to promptly terminating the etch processing when the high-k layer has been removed from the source/drain regions. While these efforts have led to control of overetching high-k layers, the present inventors have recognized that devices having features formed in high-k materials can still suffer from reliability and/or operational problems.

SUMMARY OF THE INVENTION

Accordingly, one object of the present invention is to provide an improved system and method for forming features in a high-k layer.

Another object of the present invention is to provide an electronic device having improved operational and/or reliability characteristics.

These and/or other object of the invention can be achieved by a method and system for plasma processing a high-k layer. The method includes reducing formation of an oxide interface layer during plasma processing of a substrate having a high-k layer formed thereon. According to embodiments of the invention, reducing the negative electrostatic charge on the surface of the high-k layer during anisotropic plasma processing, is found to reduce the formation of an oxide interface layer which in turn can improve the etch profile of the high-k layer and reduce oxidation of the substrate.

In one aspect of the invention, a method for plasma processing a high-k layer includes providing a substrate having a high-k layer formed thereon, on a substrate holder in a process chamber, and creating a plasma in the process chamber to thereby expose the high-k layer to the plasma. RF power is applied to the substrate holder, the RF power having a characteristic to reduce a rate of formation of an oxide interface layer located between the substrate and the high-k layer.

In another aspect of the invention, a method for plasma processing a gate stack includes providing, on a substrate holder in a process chamber, a gate stack containing a substrate having an interface layer formed on the substrate, a high-k layer formed on the interface layer, and a patterned gate electrode layer formed on the high-k layer, and creating a plasma in the process chamber to thereby expose the high-k layer to the plasma in an anisotropic etch process. RF power is applied to the substrate holder, the RF power having a characteristic to reduce a rate of formation of an oxide interface layer located between the substrate and the high-k layer next to the gate stack.

According to another aspect of the invention, a semiconductor device includes a substrate, an interface layer formed on the substrate, and a high-k layer formed on the interface layer. An etch feature formed in the high-k layer and extends to the substrate thereby defining a first substrate surface where no interface layer or high-k layer exist, and a second substrate surface having the interface layer and the high-k layer stacked thereon. The first substrate surface is substantially coplanar with the second substrate surface.

According to yet another aspect of the invention, a semiconductor device includes a substrate, an interface layer formed on the substrate and a high-k layer formed on the interface layer. An etch feature formed in the high-k layer and extends to the substrate thereby forming on the substrate a gate stack comprising the interface layer, the high-k layer and a patterned gate electrode layer formed on the high-k layer. A first substrate surface under the gate stack is substantially coplanar with a second substrate surface adjacent to the gate stack.

In still another aspect of the invention, a semiconductor device includes a substrate, an interface layer formed on the substrate and a high-k layer formed on the interface layer. An etch feature formed in the high-k layer and extends to the substrate thereby forming on the substrate a gate stack comprising the interface layer, the high-k layer and a patterned gate electrode layer formed on the high-k layer. An etch profile of the gate stack has a diminished bird's beak profile.

BRIEF DESCRIPTION OF THE DRAWINGS

In the accompanied drawings:

FIGS. 1A-1B show schematic cross-sectional representations of gate stacks containing a high-k layer according to embodiments of the present invention;

FIGS. 2A-2C show a schematic cross-sectional representation of formation of an oxide interface layer during plasma processing of a high-k layer;

DETAILED DESCRIPTION OF EMBODIMENTS OF THE INVENTION

Figure 2B:
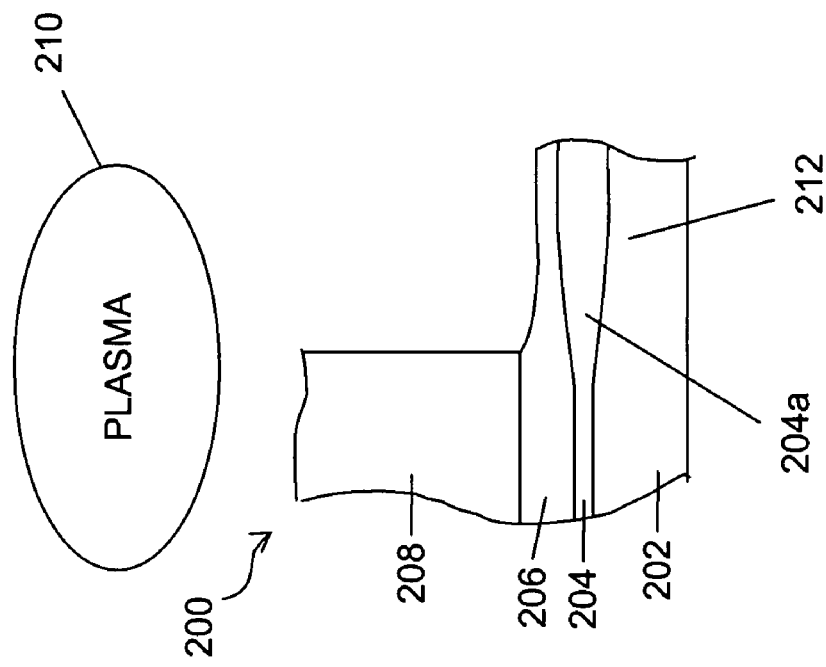

FIGS. 1A-1B show schematic cross-sectional representations of gate stacks containing a high-k layer that can be formed according to embodiments of the present invention. FIG. 1A shows a partially completed gate stack 100 after an anisotropic plasma etch process that forms the etch features shown. The exemplary gate stack 100 contains a substrate 102 having a source region 113 and a drain region 114, an interface layer 104, a high-k layer 106, a gate electrode layer 108, an anti-reflective coating (ARC)/hardmask layer 110, and a photoresist layer 112. The etch features are formed in the source area 113 and the drain area 114 of the substrate to define the gate stack 100. As seen in FIG. 1A, a surface of the substrate 113 under the gate stack 100 is substantially coplanar with a surface of the substrate in the etched areas, as will be further described below. The substrate 102 can, for example, contain Si, Ge, Si/Ge, or GaAs. In one embodiment of the invention, the substrate 102 can be a Si substrate containing epitaxial Si or poly-Si. A Si substrate can be of n- or p-type, depending on the type of device being formed. The substrate 102 can be of any size, for example a 200 mm substrate, a 300 mm substrate, or an even larger substrate.

The interface layer 104 can, for example, be an oxide layer (e.g., $SiO_2$), a nitride layer (e.g., $SiN_x$), or an oxynitride layer (e.g., $SiO_xN_y$). Integrated circuits containing a Si substrate commonly employ $SiO_2$ and/or $SiO_xN_y$ interface layers that can have excellent electrical properties, including high electron mobility and low electron trap densities. Currently, gate stacks containing a high-k layer formed on $SiO_2$ and/or $SiO_xN_y$ interface layers can require an interface layer thickness of only about 5-10 Angstroms (Å).

The high-k layer 106 can, for example, contain $Ta_2O_5$, $TiO_2$, $ZrO_2$, $Al_2O_3$, $Y_2O_3$, $HfSiO_x$, $HfO_2$, $ZrSiO_x$, $TaSiO_x$, $SrO_x$, $SrSiO_x$, $LaO_x$, $LaSiO_x$, $YO_x$, or $YSiO_x$, or combinations of two or more thereof. The thickness of the high-k layer 106 can, for example, be between about 20 Å and about 200 Å, and can be about 40 Å. The gate electrode layer 108 in FIG. 1A can, for example, be doped poly-Si. Selection of the appropriate ARC/hardmask layer 110 and photoresist layer 112 that enables formation of etch features with the desired dimensions are well known to persons skilled in the art of lithography and plasma etching.

FIG. 1B shows another partially completed gate stack 101 after an anisotropic plasma etch process that forms the etch features shown. The gate stack 101 contains a metal gate electrode layer 107 in addition to the materials layers shown in FIG. 1A. The metal gate electrode layer 107 can, for example, be about 100 Å thick and can contain W, Al, TaN, TaSiN, HfN, HfSiN, TiN, TiSiN, Re, Ru, or SiGe. The introduction of metal gate electrodes to replace or to be integrated with the traditional poly-Si gate electrode layer can bring about several advantages, including elimination of the poly-silicon gate depletion effect, reduction in sheet resistance, better reliability and potentially better thermal stability on advanced high-k layers.

Figure 5:
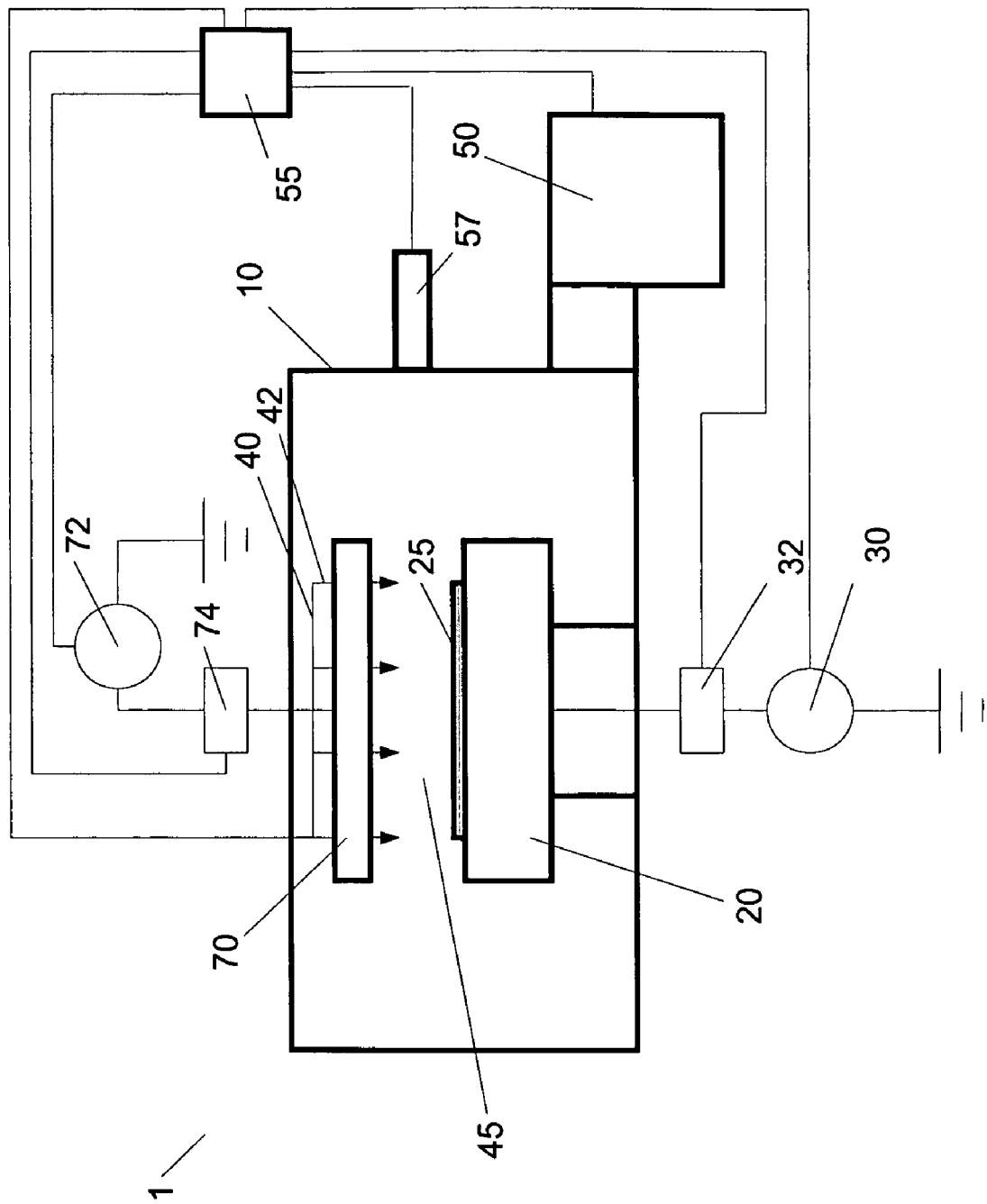
FIG. 5 shows a plasma processing system according to an embodiment of the present invention.

The gate stacks of FIGS. 1A and 1B may be formed in a plasma etch chamber such as that described in FIG. 5. As seen in FIG. 5, the etch system may include an RF source coupled to an upper electrode for forming a plasma and an RF system coupled to a substrate holder for holding a substrate to be processed. As will be described below, adjustment of the substrate RF power may be used to control of overetching of high-k layers. However, the present inventors have recognized that despite efforts to control overetching of high-k layers, devices having featured formed in a high-k material can still show poor characteristics. Thus, the present inventors have intensively studied the process of etching a high-k gate stack structure in an effort to improve the formation of features in high-k layers.

Figure 2A:
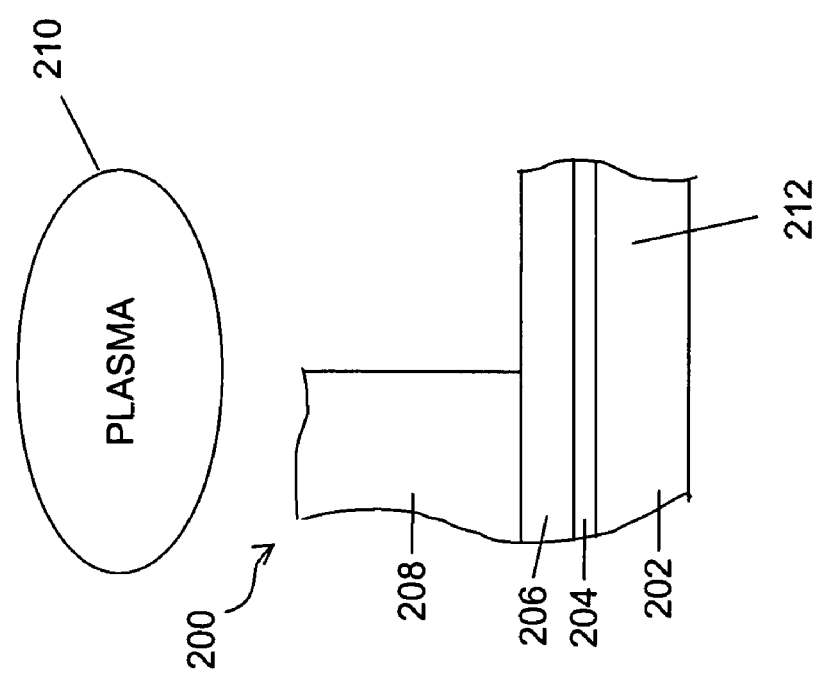

FIGS. 2A-2C show a schematic cross-sectional representation of formation of an oxide interface layer during plasma processing of a high-k layer. FIG. 2A shows an exemplary gate stack 200 containing a substrate 202, an interface layer 204, a high-k layer 206, and a patterned gate electrode layer 208. Removal of the high-k layer 206 from the source/drain region 212 is required prior to performing an ion implant process to alleviate the risk of a knock-on implantation of impurities from the high-k layer 206 into the source/drain region 212 of the substrate 202. However, low plasma etch selectivity of the high-k 206 layer (e.g., $HfO_2$) relative to the interface layer 204 (e.g., $SiO_2$) and the substrate 202 (e.g., Si) can be problematic when attempting to anisotropically etch the high-k layer 206 and terminate the etch process on the interface layer 204 or on the substrate 202. In the case of a Si substrate 202 and a $SiO_2$ interface layer 204, over-etching the high-k layer 206 can lead to excessive removal of $SiO_2$ and Si from the source/drain region 212 of the substrate 102, thereby damaging or destroying the function of the semiconductor device.

Anisotropic etching of the high-k layer 206 by the plasma 210 can involve the use of aggressive halogen-containing gases with general formulas HX, $X_2$, $C_xX_z$, or $C_xH_yX_z$, where X is a halogen. The halogen-containing gases can chemically react with the high-k layer 206 in a reactive etch process, but can have very low selectivity towards etching of the high-k layer 206 relative etching of the interface layer 204 or the substrate 202. These halogen-containing gases (e.g., $CF_4$ in the presence of $O_2$) often necessitate the use of elevated substrate temperatures (e.g., T>300° C.) to increase the volatility of the high-k etch products. The use of these gases may furthermore require a large physical etch component and polymer formation to achieve adequate etch selectivity. Consequently, there is a risk of damaging the underlying substrate 202 if the etch process is not promptly terminated when the high-k layer 206 has been removed. This prompt termination of a pure etch process has proven difficult to achieve.

However, a plasma modifying/thinning process can utilize the RF power on the substrate holder to assist in anisotropically removing the high-k layer 206 from the source/drain region 212 without overetching. Specifically, this process can use ion bombardment to partially remove and/or modify the high-k layer 206 without completely removing it. In one example, the plasma can contain a reactive gas, for example HBr or HCl, and an inert gas. In another example, the plasma may only contain chemically inert gas species that are non-reactive towards the high-k layer 206 in a plasma environment, but where the ions have sufficient energy to effectively disrupt and/or thin the high-k layer 206 so that a subsequent wet etching process is able to efficiently remove the disrupted (modified) high-k layer 206. The inert gas can, for example, contain the noble gases He, Ne, Ar, Kr, and Xe.

The exact effect of the plasma modifying/thinning process on the high-k layer 206 is currently not known and may depend on the gases used in the plasma processing. However, the plasma processing may increase the amorphous content of the high-k layer 206 and possibly break chemical bonds that create atomic fragments in the high-k layer 206. The suggested disruption of the molecular structure of the high-k layer during plasma processing can allow for a greater choice of wet etch chemistries that have high etch selectivity of the high-k 206 relative to the interface layer 204 and the substrate 202 thereby improving the ability to stop etching at the interface layer. The subsequent wet etch process can, for example, utilize hot sulfuric acid ($H_2SO_4$) or hydrofluoric acid ($HF_{(aq)}$), resulting in selective removal of the modified high-k layer 206 and the interface layer 204 from the substrate 202.

In the above process, when the high-k layer 206 is not traversed during the plasma modifying/thinning process, the likelihood of damage occurring to the underlying substrate 202 is reduced. However, if the thinning step is carried out for too long, the high-k layer 206 is traversed, resulting in damage to the underlying substrate 202. RF bias on the substrate holder can be adjusted to control this thinning step. Specifically, higher RF power on the substrate holder provides greater ion bombardment that is useful for etching high-k layers that have limited volatility, while lower RF power is needed to reduce the possibility of etching into the substrate source and drain regions. Thus, adjusting the RF power on the substrate holder can be used to control overetching of the high-k layers. As indicated above, however, device problems still persist.

FIG. 2B schematically shows partial removal of the high-k layer 206 by plasma processing, where the plasma process was stopped before complete removal of the high-k layer 206 from the source/drain region 212 of the substrate 202. Non-uniform etching of the high-k layer 206 and an increase in the thickness of the interface layer 204 were observed at the edge of the gate stack 200. The increased thickness of the interface layer 204 is in part due to oxidization of the substrate 202 (e.g., oxidation of Si to form $SiO_2$). In addition, $SiO_2$ that replaces the Si occupies more volume than the Si consumed, which also contributes to an increase in thickness of the interface layer. As schematically shown in FIG. 2B, the increase (swelling) in the thickness of the interface layer 204 can occur prior to complete removal of the high-k layer 206 from the source/drain region 212.

In FIG. 2B, the increase in the thickness of the interface layer 204 at the edge of the gate stack 200 is referred to as a "bird's beak" 204a. While formation of the bird's beak 204a has little effect on electrical results of a long channel resistor, it can strongly affect resistors and other devices with a short channel length. For example, an increase in the effective oxide thickness due to increase in the interface layer thickness can lead to reduction in the gate control of the channel. Thus, the present inventors have recognized that control over the thickness of the interface layer 204 can be critical for the electrical performances of deep sub-micron CMOS devices. FIG. 2C shows the gate stack 200 following complete removal of the high-k layer 206 and the interface layer 204 from the source/drain region 212. As described above, the removal of the high-k layer 206 can be performed by reactive plasma etching or by a plasma modification/thinning step followed by a wet processing step. As seen in this figure, the processed gate stack 200 contains an etched high-k layer 206 with a tapered section 206a, an interface layer 204 with a bird's beak 204a, and a source/drain region 212 where removal of material from the substrate 202 has occurred. This removal of material from the substrate 202 can occur even if etch selectivity is properly controlled using the techniques described above. Specifically, the present inventors have recognized that the removal of the source substrate material is due to consumption of this material by the oxide swelling process. A properly controlled etch process then removes the swelled oxide layer with an end result being removal of substrate material similar to that which would occur by overetching. The problems shown in FIG. 2C can reduce the operation and/or reliability characteristics of devices, and can exist both for high-temperature reactive plasma etching and plasma modifying/thinning processing that is followed by wet processing.

EXAMPLE

Plasma Processing of a $HfO_2$ High-K Layer using Ar Plasma

Figure 2D:
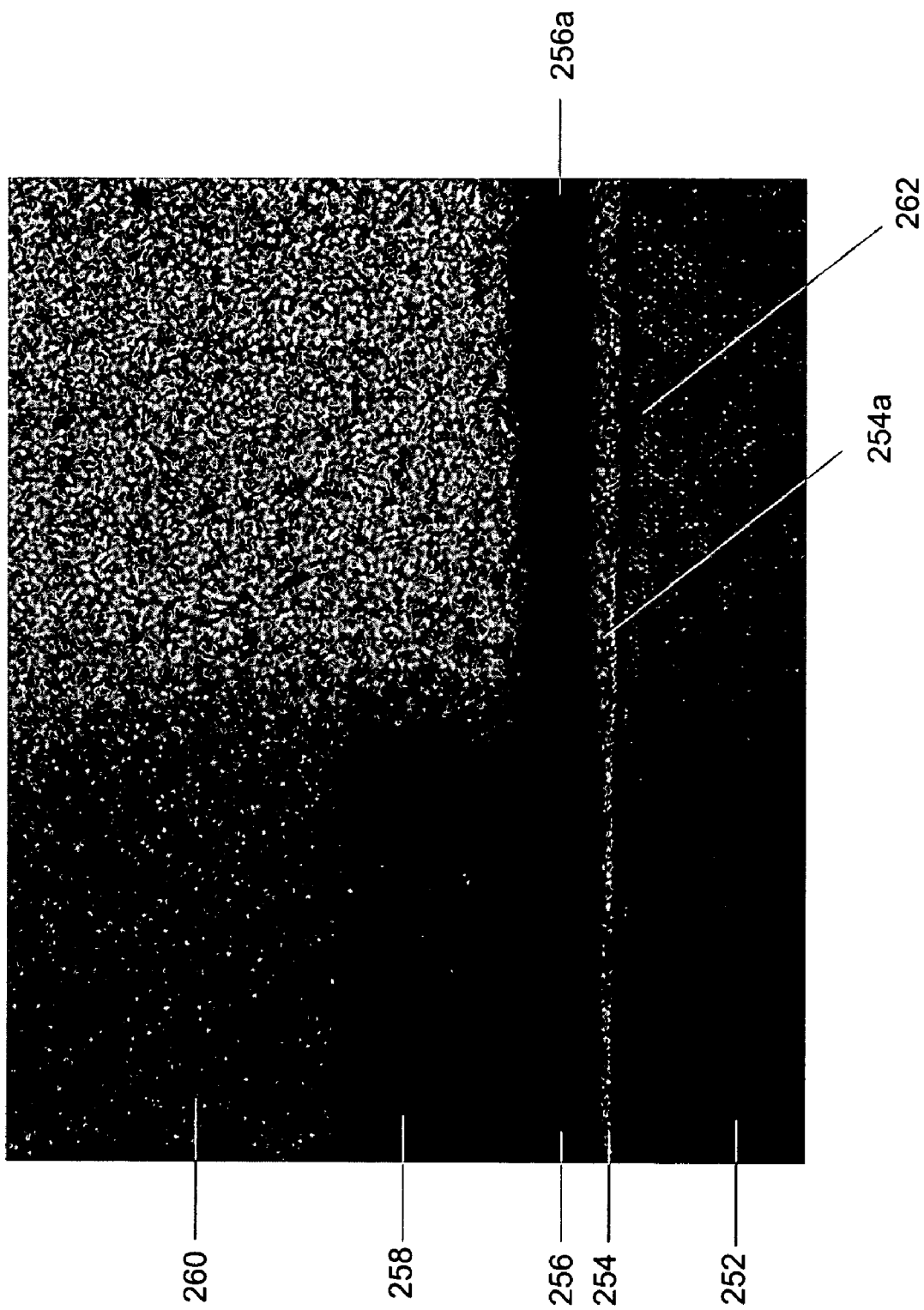
FIGS. 2D-2E show TEM images of gate stacks following plasma processing of the gate stacks.
Figure 2E:
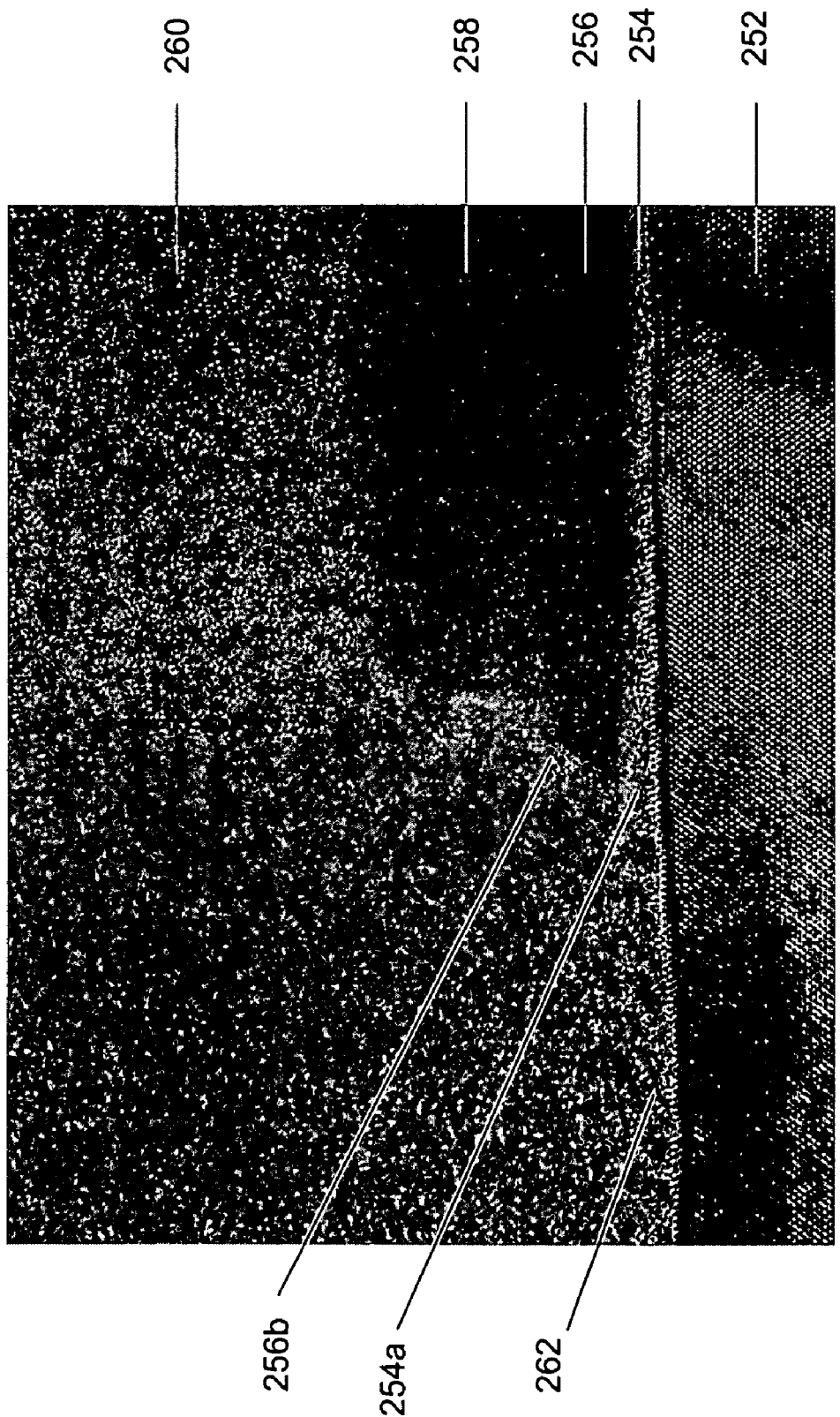

FIGS. 2D-2E show TEM images of a gate stack following plasma processing of the gate stacks. The gate stack contains a 56 Å thick $HfO_2$ high-k layer 256 overlying a 5 Å thick $SiO_xN_y$ interface layer 254 on a Si substrate 252. The gate stack further contains a TiN metal electrode layer 258 and a poly-Si electrode layer 260. The gate stack was exposed to an Ar plasma in a capacitively coupled plasma processing system as is schematically shown in FIG. 5, for example. The RF power on the substrate holder is controlled only to control thinning of the high-k layer as discussed above. Following plasma modification/thinning of the $HfO_2$ high-k layer 256a, the thicknesses of the $HfO_2$ high-k layer 256a and the oxide interface layer 254a in the source/drain region 262 at the edge of the gate stack were 48 Å and 12 Å, respectively. Thus, plasma processing of the $HfO_2$ high-k layer increased the thickness of the interface layer 254 from 5 Å to 12 Å while partially removing the $HfO_2$ high-k layer 256a. FIG. 2D further shows removal of Si material from the source/drain region 262 due to oxidation of the Si substrate 252.

FIG. 2E is a TEM image of a gate stack following plasma processing and wet processing of the gate stack. FIG. 2E shows the presence of a bird's beak 254a, a patterned high-k layer 256 with a tapered etch profile 256b, and removal of Si material from source/drain region 262 of the substrate 252.

Figure 3B:
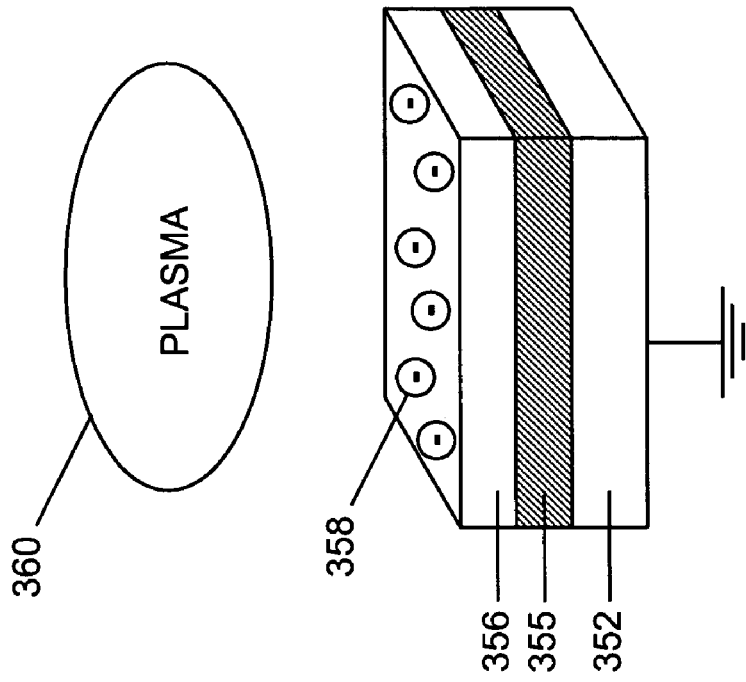
FIGS. 3A-3B schematically show electric field enhanced formation of an oxide interface layer during plasma processing of a high-k layer.
Figure 3A:
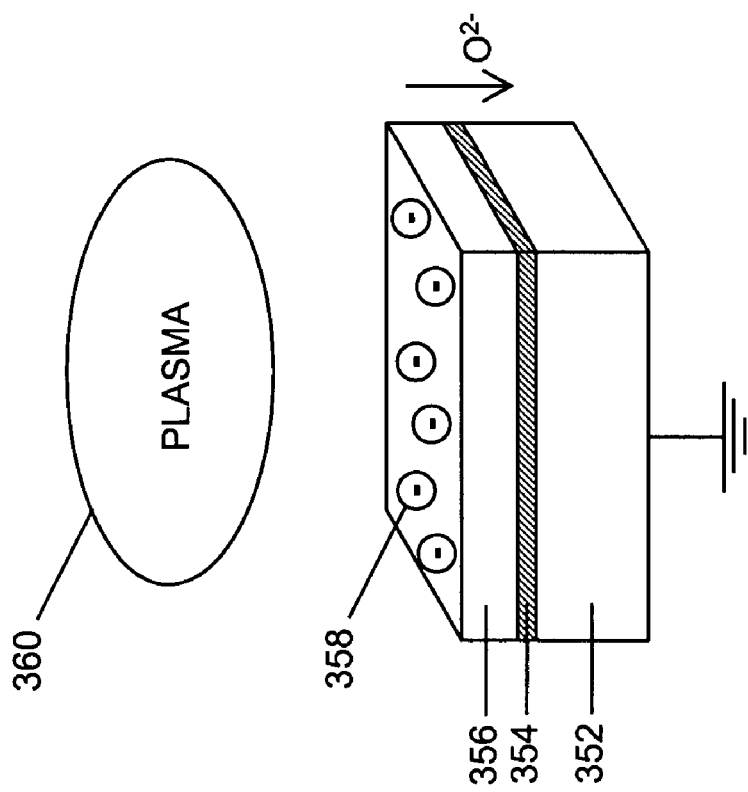

The current inventors have realized that the abovementioned problems can be reduced by minimizing the increase in thickness of the interface layer during plasma processing of a high-k layer formed on a substrate. Thus, embodiments of the current invention are directed towards minimizing the increase in the thickness of an interface layer during plasma processing of a high-k layer, where the plasma processing can, for example, include plasma modification/thinning of the high-k layer or reactive etching of the high-k layer. The current inventors believe that an increase in the thickness of the interface layer, observed during plasma processing of a high-k layer, is due to electric field (E-field) enhanced oxidation of the interface layer and the substrate. This is schematically shown in FIGS. 3A-3B. According to an embodiment of the invention, increase in the thickness of the interface layer can be reduced by selecting plasma processing parameters that reduce the electric field enhanced oxidation of the interface layer and the substrate during plasma processing of a high-k layer.

FIGS. 3A-3B schematically show electric field enhanced formation of an oxide interface layer during plasma processing of a high-k layer. With the substrate 352 at ground potential, exposing the high-k layer 356 to the plasma environment 360 results in accumulation of electrons 358 on the surface of the high-k layer 356 to form a net negative electrostatic charge. The charging of the surface of high-k layer 356 is a result of the capacitor-like behavior of the high-k layer 356, where the grounded substrate 352 is one of the plates of the capacitor, and the negatively charged surface of the high-k layer 356 is the other. Alternately, with the substrate 352 electrically isolated from the ground potential, exposure of the high-k layer 358 to the plasma environment 360 also results in accumulation of electrons 358 on the surface of the high-k layer 356 to form a net negative electrostatic charge. While the substrate is shown grounded in FIGS. 3A and 3B the negative charge on the high-k layer 356 can also result if RF bias is applied to the substrate without proper consideration of the capacitor effect described above.

The present inventors have recognized that, during plasma processing of the high-k layer 356, the strong electric field induced by the surface charging can extract oxygen ions ($O^{2-}$) from the high-k layer 356 (e.g., $HfO_2$, or $HfSiO_x$) into the underlying interface layer 354 and the substrate 352. This forms an interface layer 355 shown in FIG. 3B that is significantly thicker than the interface layer 354 shown in FIG. 3A resulting in the problems discussed above.

Figure 4B:
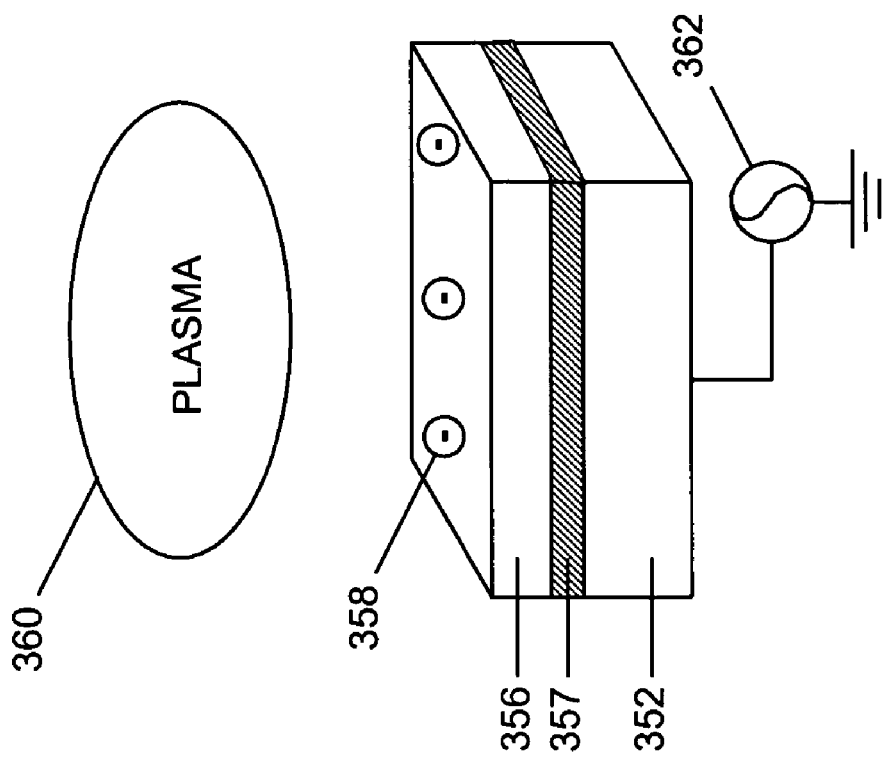
FIGS. 4A-4B schematically show a method of minimizing formation of an oxide interface layer during plasma processing of a high-k layer according to an embodiment of the present invention.
Figure 4A:
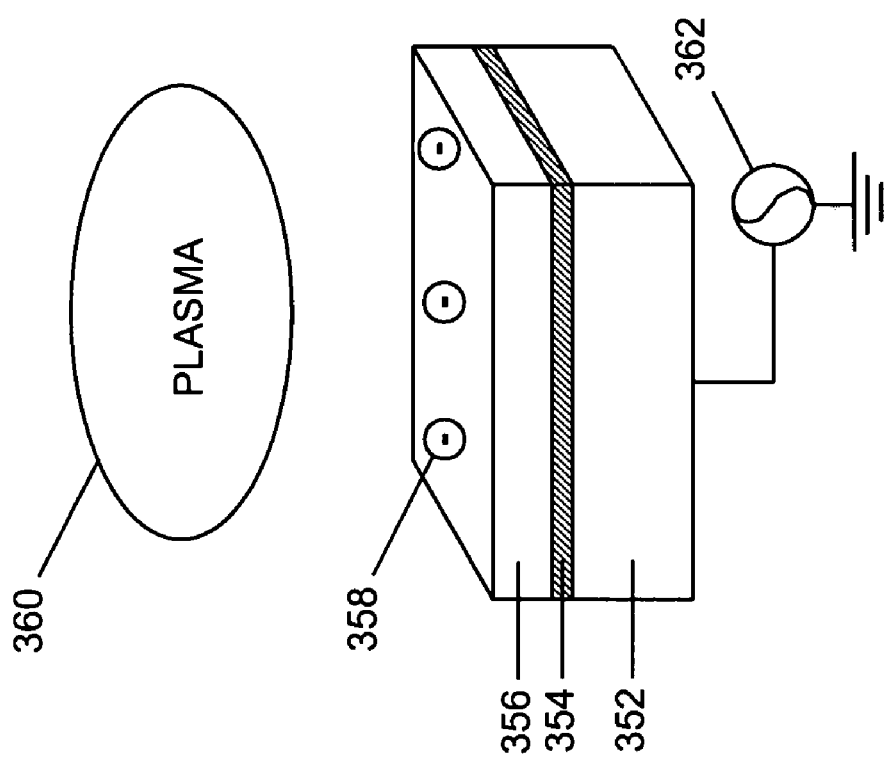

FIGS. 4A-4B schematically show a method of minimizing formation of an oxide interface layer during plasma processing of a high-k layer according to an embodiment of the present invention. According to embodiments of the invention, applying RF power from a RF power source 362 coupled to the substrate 352, instead of grounding the substrate 352 as shown in FIGS. 3A-3-B, can effectively reduce accumulation of electrons 358 on the surface of the high-k layer 356 by increasing collisions of positive ions from the plasma 360 with the high-k layer 356. Moreover, in etch systems where RF bias is already applied to the substrate holder to control for example overetching as discussed above, a proper power level of the RF bias can be selected to further reduce the accumulation of electrons 358 on the high-k layer. That is, the present inventors have discovered that adjusting the RF level on the substrate to control etching is not sufficient to prevent accumulation of a negative charge on the surface of the high-k layer 356. Reduced accumulation of electrons 358 on the surface of the high-k layer 356 reduces the negative electrostatic charge on the high-k layer, thereby minimizing the electric field and the electric field enhanced oxidation of the interface layer 354 and the substrate 356.

FIG. 4B shows a schematic representation of high-k structure that has been subjected to an embodiment of the present invention. As seen in this figure, the interface layer 357 is significantly thinner than the interface layer 355 in FIG. 4B that has not been subjected to an embodiment of the present invention. Thus, by applying RF power that reduces the accumulation of electrons 358 on the surface of the high-k layer 356, reduced oxidation of the interface layer 354 and the substrate 356 takes place. Moreover, this reduced oxidation provides an improved etch profile with a diminished bird's beak profile. As used herein, diminished bird's beak profile means an etch profile of a high-k structure that has either no bird's beak or a reduced bird's beak relative to an etch profile formed without consideration of reducing the accumulation of electrons on the high-k material. Further the reduced oxidation allows a substrate surface under the interface film to be substantially coplanar to a substrate surface in an etched area. As used herein, substantially coplanar means more coplanar than a feature formed without consideration of reducing the accumulation of electrons on the high-k material.

Referring back to FIG. 2B-2C, embodiments of the current invention can minimize the electric field induced oxidation of the interface layer 204 and the substrate 202, thereby reducing the formation of the bird's beak 204a, reducing the tapered etch profile 206a, and reducing removal of material from source/drain region 212 of the substrate 202.

A potential drawback of applying RF power to a substrate during plasma processing of a substrate is the reduction in etch selectivity of the high-k layer relative to the underlying interface layer and the substrate. However, in one example, adding small amounts of $N_2$ gas to the process gas can enhance nitridation of the interface layer and increase etch selectivity.

Embodiments of the current invention can be applied to processing plasmas containing a process gas that includes an inert gas, a reactive gas, or both. The inert gas can contain He, Ne, Ar, Kr, or Xe, or a combination of two or more thereof. The reactive gas can contain HX (e.g., X=Cl, Br), $X_2$ (e.g., X=Cl, Br), $C_xX_z$ (X=halogen), $C_xH_yX_z$ (X=halogen), or a combination of two or more thereof. The process gas can further contain $H_2$. A process gas containing an inert gas and a reactive gas can, for example, include HCl+Ar, HBr+Ar, $Cl_2+H_2$+Ar, or $CF_4+O_2$+Ar.

FIG. 5 shows a plasma processing system according to an embodiment of the present invention. The plasma processing system 1 is configured to facilitate the generation of plasma in processing region 45 of the process chamber 10. The plasma processing system 1 further comprises a substrate holder 20, upon which a substrate 25 to be processed is affixed and makes electrical contact to, and a gas injection system 40 for introducing process gas 42 to the plasma process chamber 10, and a vacuum pumping system 50. The gas injection system 40 allows independent control over the delivery of the process gas 42 to the process chamber 10 from ex-situ gas sources.

An ionizable process gas 42 is introduced via the gas injection system 40 and the process pressure is adjusted. The flow rate of the process gas can be between about 10 sccm and about 5000 sccm, alternately between about 20 sccm and about 1000 sccm, and still alternately between about 50 sccm and about 500 sccm. The chamber pressure can, for example, be between about 1 mTorr and about 200 mTorr, alternately between about 5 mTorr and about 100 mTorr, still alternately between about 10 mTorr and about 50 mTorr. The controller 55 can be used to control the vacuum pumping system 50 and gas injection system 40. Substrate 25 is transferred into process chamber 10 through a slot valve (not shown) and chamber feed-through (not shown) via a (robotic) substrate transfer system where it is received by substrate lift pins (not shown) housed within substrate holder 20 and mechanically translated by devices housed therein. Once the substrate 25 is received from the substrate transfer system, it is lowered to an upper surface of the substrate holder 20.

In an alternate embodiment, the substrate 25 is affixed to the substrate holder 20 via an electrostatic clamp (not shown). Furthermore, the substrate holder 20 further includes a cooling system including a re-circulating coolant flow that receives heat from the substrate holder 20 and transfers heat to a heat exchanger system (not shown), or when heating, transfers heat from the heat exchanger system. Moreover, gas may be delivered to the backside of the substrate to improve the gas-gap thermal conductance between the substrate 25 and the substrate holder 20. Such a system is utilized when temperature control of the substrate is required at elevated or reduced temperatures. For example, temperature control of the substrate may be useful at temperatures in excess of the steady-state temperature achieved due to a balance of the heat flux delivered to the substrate 25 from the plasma and the heat flux removed from substrate 25 by conduction to the substrate holder 20. In other embodiments, heating elements, such as resistive heating elements, or thermoelectric heaters/coolers are included in the substrate holder 20.

The plasma processing system 1 of FIG. 5 includes a RF plasma source that contains an upper plate electrode 70 to which RF power is coupled from a RF generator 72 through an impedance match network 74. A typical frequency for the application of RF power to the upper plate electrode 70 can range from 10 MHz to 200 MHz and can be 60 MHz. The RF power applied to the upper plate electrode 70 can be between about 50 Watts (W) and about 5,000 W. Alternately, the RF power applied to the upper plate electrode 70 can be between about 100 W and about 1,000 W. As noted above, the plasma processing system 1 of FIG. 5 further includes a RF source for applying RF power to the substrate holder 20 to bias the substrate 25. The RF source contains a RF generator 30 and an impedance match network 32 that serves to maximize the transfer of RF power to plasma to the processing region 45 by minimizing the reflected power. Match network topologies (e.g., L-type, π-type, T-type) and automatic control methods are known in the art. A typical frequency for the application of power to the substrate holder 20 ranges from 0.1 MHz to 30 MHz and can be 2 MHz. The RF power applied to the substrate holder 20 can be between about 10 W and about 500 W. Alternately, the RF power applied to the substrate holder 20 can be between about 20 W and about 100 W. Moreover, the controller 55 is coupled to the RF generator 72 and the impedance match network 74 in order to control the application of RF power to the upper plate electrode 70. In an alternate embodiment, RF power can be applied to the substrate holder 20 at multiple frequencies.

With continuing reference to FIG. 5, a process gas 42 is introduced to the processing region 45 through the gas injection system 40. Gas injection system 40 can include a showerhead, wherein the process gas 42 is supplied from a gas delivery system (not shown) to the processing region 45 through a gas injection plenum (not shown), a series of baffle plates (not shown) and a multi-orifice showerhead gas injection plate. In one embodiment, the multi-orifice showerhead gas injection plate can be the upper plate electrode 70.

Vacuum pump system 50 can include a turbo-molecular vacuum pump (TMP) capable of a pumping speed up to 5000 liters per second (and greater), and a gate valve for throttling the chamber pressure. In conventional plasma processing devices utilized for dry plasma etch, a 1000 to 3000 liter per second TMP is employed. TMPs are useful for low pressure processing, typically less than 50 mTorr. For high pressure processing (i.e. greater than 100 mTorr), a mechanical booster pump and dry roughing pump are used.

A controller 55 includes a microprocessor, a memory, and a digital I/O port capable of generating control voltages sufficient to communicate and activate inputs to the plasma processing system 1 as well as monitor outputs from the plasma processing system 1. Moreover, the controller 55 is coupled to and exchanges information with the RF generator 30, the impedance match network 32, the RF generator 72, the impedance match network 74, the gas injection system 40, plasma monitor system 57, and the vacuum pump system 50. A program stored in the memory is utilized to control the aforementioned components of a plasma processing system 1 according to a stored process recipe. One example of controller 55 is a digital signal processor (DSP); model number TMS320, available from Texas Instruments, Dallas, Tex.

The plasma monitor system 57 can comprise, for example, an optical emission spectroscopy (OES) system to measure excited particles in the plasma environment and/or a plasma diagnostic system, such as a Langmuir probe, for measuring plasma density. The plasma monitor system 57 can be used with controller 55 to determine the status of the etching process and provide feedback to ensure process compliance. Alternately, plasma monitor system 57 can comprise a microwave and/or a RF diagnostic system.

Figure 6:
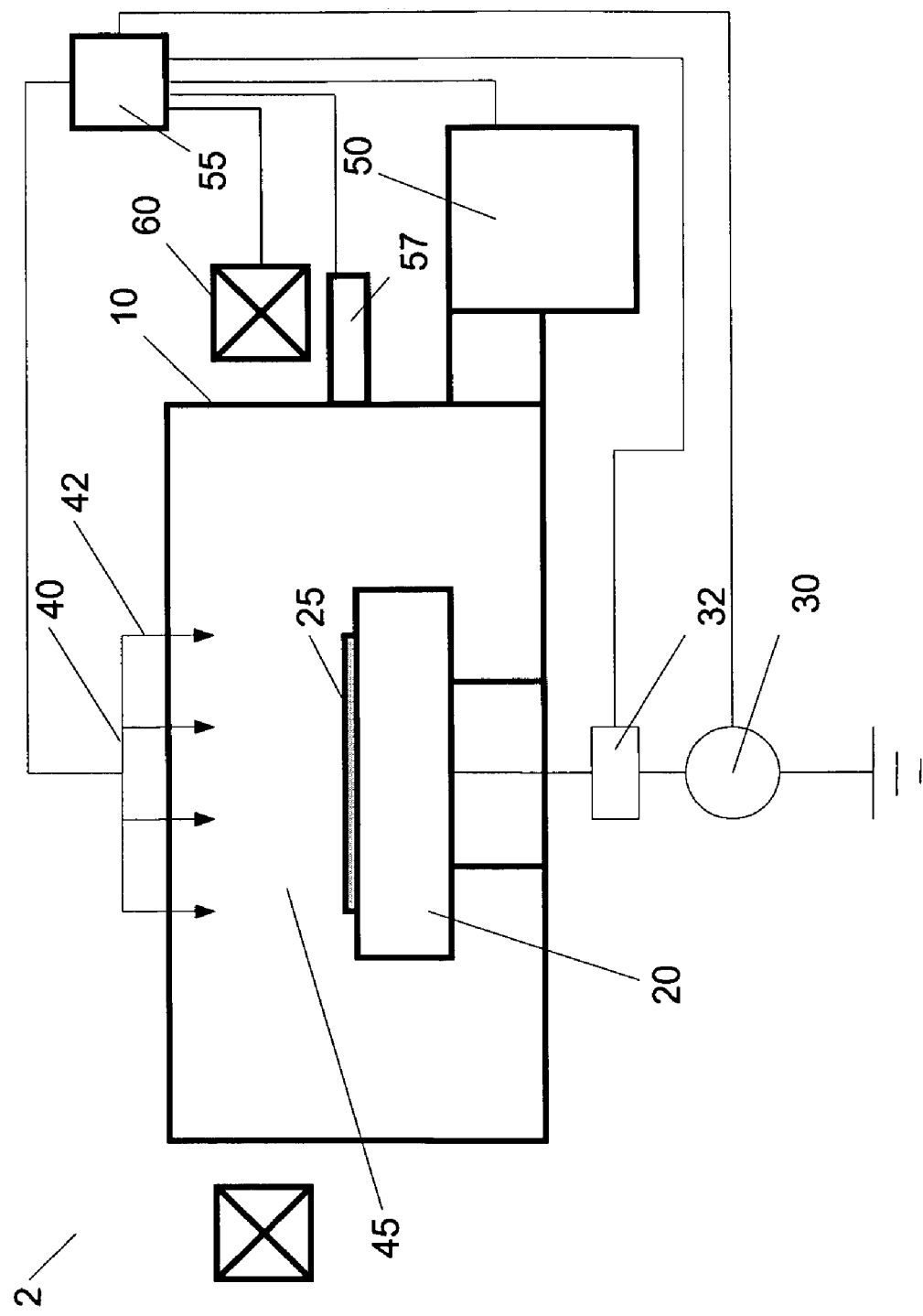
FIG. 6 shows a plasma processing system according to another embodiment of the present invention.

FIG. 6 shows a plasma processing system according to another embodiment of the present invention. The plasma processing system 2 includes a RF plasma source comprising either a mechanically or electrically rotating DC magnetic field system 60, in order to potentially increase plasma density and/or improve plasma processing uniformity. Moreover, the controller 55 is coupled to the rotating magnetic field system 60 in order to regulate the speed of rotation and field strength.

Figure 7:
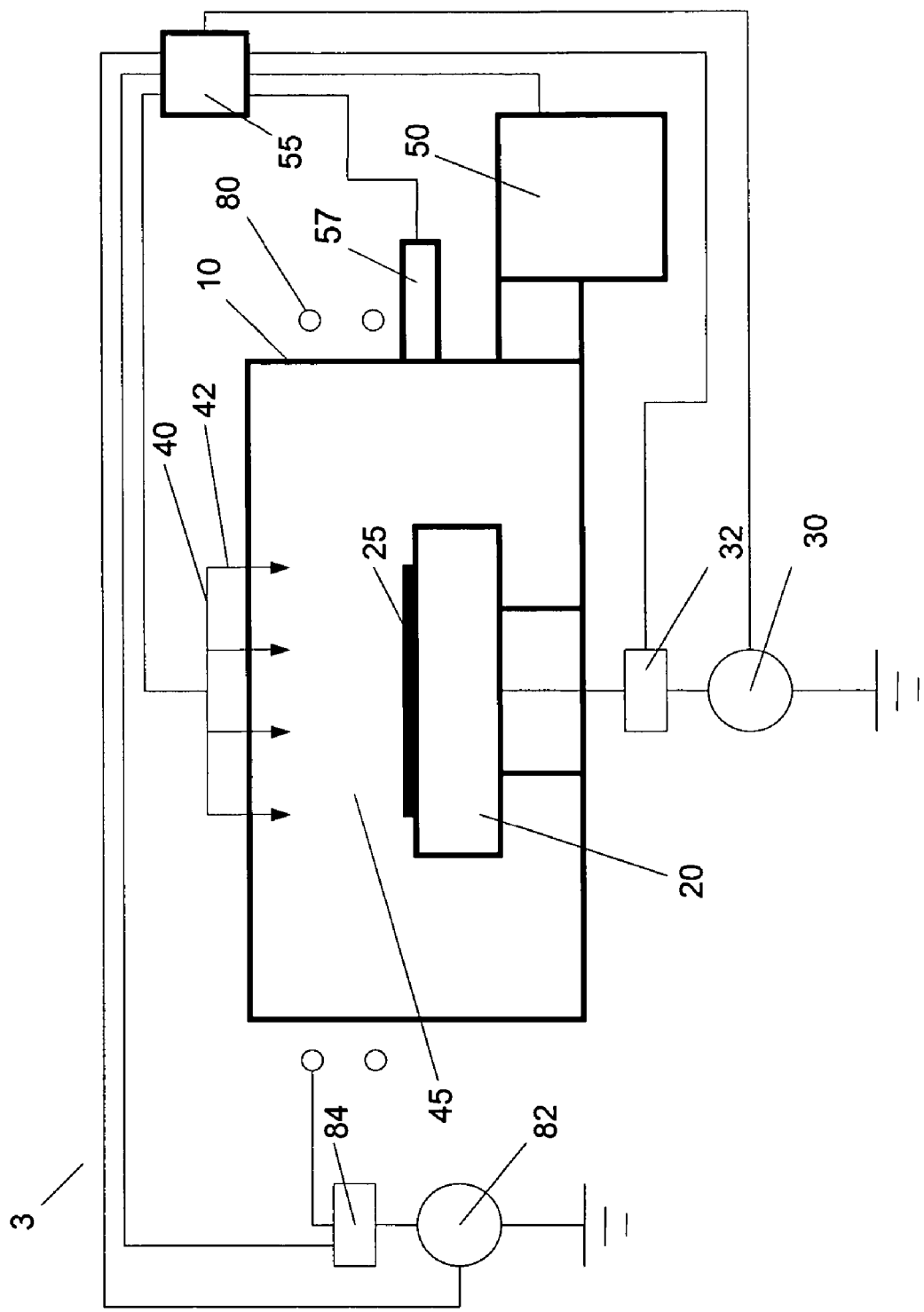
FIG. 7 shows a plasma processing system according to yet another embodiment of the present invention.

FIG. 7 shows a plasma processing system according to yet another embodiment of the present invention. The plasma processing system 3 includes a RF plasma source comprising an inductive coil 80 to which RF power is coupled via a RF generator 82 through an impedance match network 84. RF power is inductively coupled from the inductive coil 80 through a dielectric window (not shown) to the plasma-processing region 45. A typical frequency for the application of RF power to the inductive coil 80 ranges from 0.1 MHz to 100 MHz and can be 13.56 MHz. The RF power applied to the inductive coil can be between about 50 W and about 10,000 W. Similarly, a typical frequency for the application of power to the chuck electrode ranges from 0.1 MHz to 30 MHz and can be 13.56 MHz. The RF power applied to the substrate holder can be between about 10 W and about 500 W. In addition, a slotted Faraday shield (not shown) can be employed to reduce capacitive coupling between the inductive coil 80 and plasma. Moreover, the controller 55 is coupled to the RF generator 82 and the impedance match network 84 in order to control the application of power to the inductive coil 80.

According to an embodiment of the present invention, the RF power applied to substrate holder of FIGS. 5-7 is selected to reduce the accumulation of a negative charge on the high-k material thereby reducing swelling of an interface layer as discussed above. The precise characteristics of the substrate bias are dependent on process specifications, material composition and other factors, and may be determined by design of experiment techniques. In addition, it is to be understood that the plasma processing systems depicted in FIGS. 5-7 are shown for exemplary purposes only, as many variations of the specific hardware can be used to implement processing systems in which the present invention may be practiced, and these variations will be readily apparent to one having ordinary skill in the art.

Figure 8:
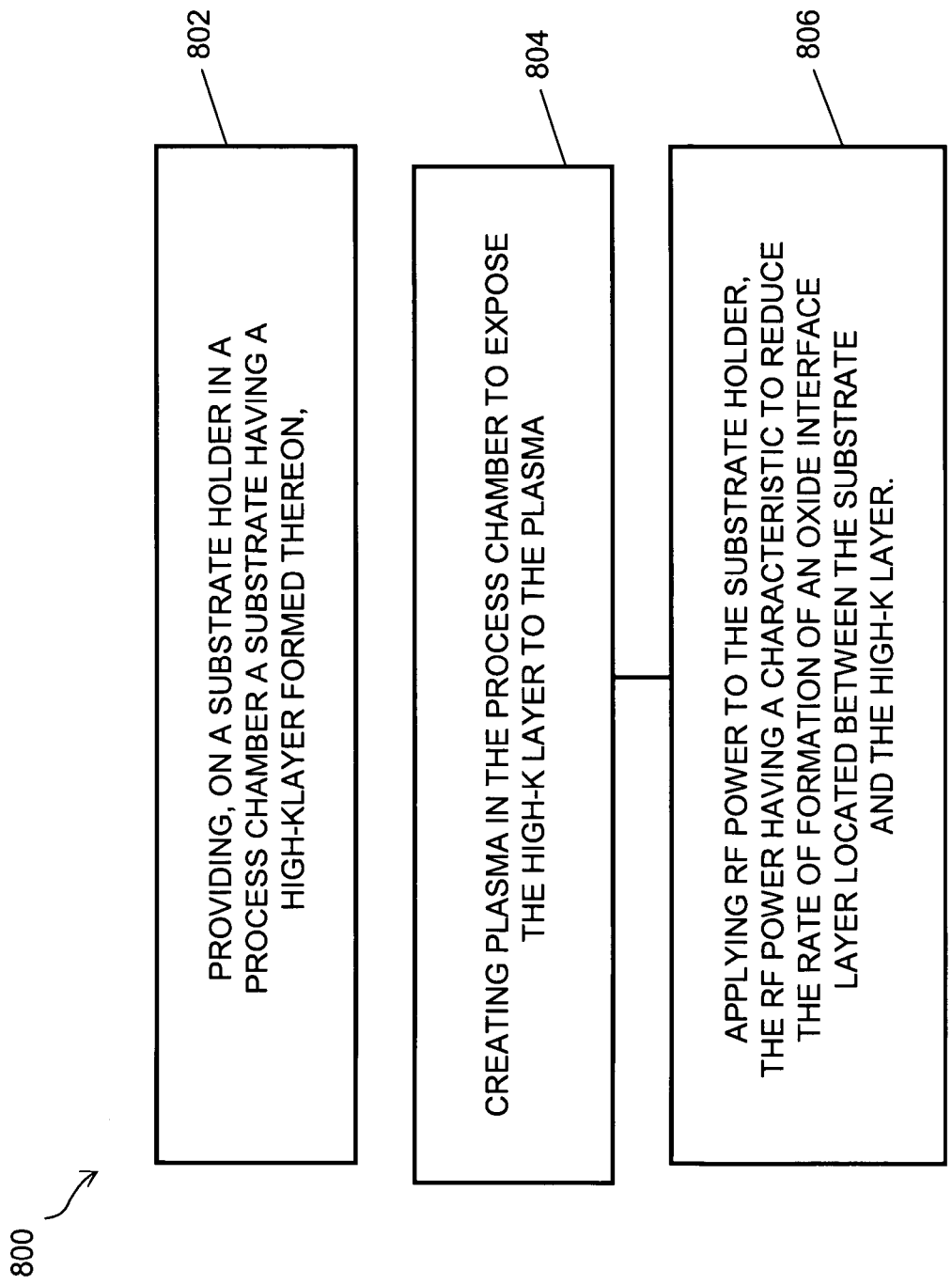
FIG. 8 shows a flowchart illustrating a method of plasma processing a high-k layer according to an embodiment of the invention.

FIG. 8 shows a flowchart illustrating a method of plasma processing a high-k layer according to an embodiment of the invention. The process 800 includes at 802, providing in a process chamber a substrate having a high-k layer formed thereon. The process chamber includes a RF plasma source and a RF source for powering the substrate holder supporting the substrate. For example, the process chamber may be one of the chambers discussed in FIGS. 5-7. At 804, a plasma is created in the process chamber to expose the high-k layer to the plasma. In 806, RF power is applied to the high-k layer. The RF power provided by the RF source is selected to reduce formation of an oxide interface layer between the substrate and the high-k layer. Step 806 may include applying RF power to the substrate during processes where RF power is normally not applied to the substrate holder. Alternatively, in processes where RF power is applied to the substrate to control overetching, for example, the RF bias power is selected for a particular characteristic that reduces interface layer swelling. The process step 804 is carried out for the desired amount of time to at least partially remove the high-k layer. In one embodiment of the invention, the plasma processing can include high-temperature reactive plasma etching for removing the high-k layer. In another embodiment of the invention, the plasma processing can include a plasma modifying/thinning process that is followed by wet processing for removing the remaining high-k layer.

EXAMPLE

Plasma Etching of a HfO$_2$ High-K Layer using HBr Plasma

A gate stack containing a 40 Å thick HfO$_2$ high-k layer overlying a 5 Å thick SiO$_x$N$_y$ interface layer on a Si substrate was exposed to a plasma containing a HBr etch gas. The process conditions included a HBr gas flow rate of 400 sccm and a process chamber pressure of 20 mTorr. The plasma processing system was a capacitively coupled plasma system as schematically shown in FIG. 5. The present inventors found that providing 40 W of power on the substrate holder can remove the HfO$_2$ at 370° C.; however, swelling of the interfacial layer still existed. Thus, the present inventors selected an RF power that further reduces the oxide swelling in accordance with the present invention. In this example, the top electrode power was reduced from 1,000 W to 200 W and the RF power applied to the substrate holder was increased from 40 W to 50 W.

Figure 9:
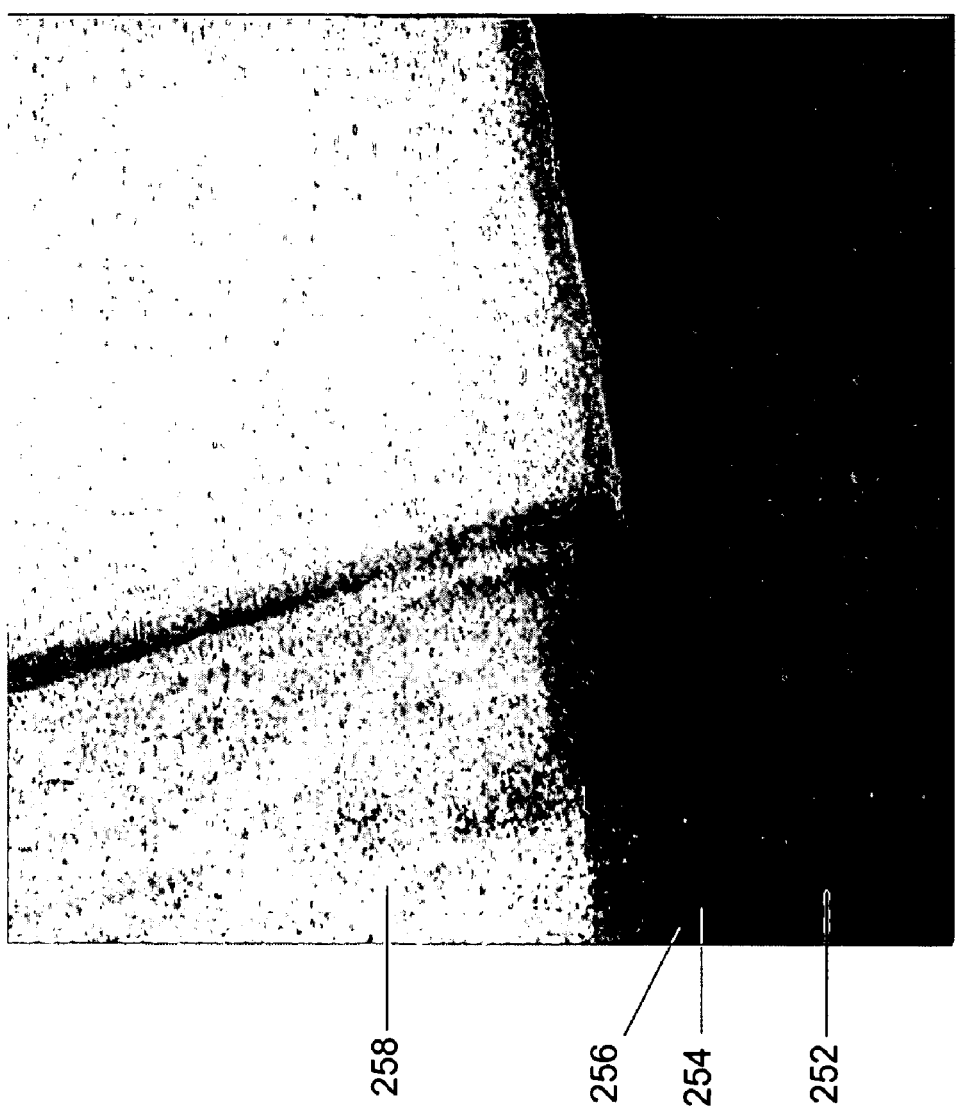
FIG. 9 shows a TEM image of a gate stack following plasma processing of the gate stack according to an embodiment of the invention.

FIG. 9 shows a TEM image of a gate stack following plasma processing of the gate stack according to an embodiment of the invention. As seen in this figure, the exemplary method significantly reduced growth of the interface layer 254 and provided a straighter HfO$_2$ etch profile with little or no taper of the HfO$_2$ layer 256 and minimum swelling of the interface layer 254. As also seen in this figure, a surface of the substrate in an etched area is substantially coplanar with a surface of the substrate in a region that has not been etched.

It is noted that FIG. 9 shows a shadow layer above the substrate in the etched region of the substrate. This shadow is not a physical layer of the structure of FIG. 9 and is believed to be a result of the TEM measurement on the material used to prepare the sample of FIG. 9 for analysis.

According to an embodiment of the invention, the RF power applied to the substrate holder can be between about 10 W and about 500 W. Alternately, the RF power applied to the substrate holder can be between about 20 W and about 100 W. The substrate holder RF power needed to achieve a good HfO$_2$ etch profile and minimum interface layer growth can, for example, vary for different post-deposition conditions (e.g., annealing) of the HfO$_2$ high-k layer and these variations will be readily apparent to one having ordinary skill in the art.

Numerous modifications and variations of the present invention are possible in light of the above teachings. It is therefore to be understood that, within the scope of the appended claims, the invention may be practiced otherwise than as specifically described herein.

What is claimed is:

1. A method for etching a high-k layer, the method comprising:
   providing a substrate having an interface layer formed on the substrate and a high-k layer formed thereon on the interface layer, on a substrate holder in a process chamber;
   selecting a plasma etch process for etching the high-k layer;
   determining an RF power to apply to the substrate holder during the plasma etch process, the RF power having a characteristic to minimize or prevent a rate of formation of an oxide interface layer located between the substrate and the high-k layer;
   creating a plasma in the process chamber to thereby expose the high-k layer to the plasma; and
   minimizing or preventing a rate of formation of an oxide interface layer by applying the RF power to the substrate holder while performing the plasma etch process to the high-k layer.

2. The method according to claim 1, wherein the interface layer comprises an oxide layer, a nitride layer, or an oxynitride layer, or a combination of two or more thereof.

3. The method according to claim 1, wherein the providing comprises providing said substrate with a high-k layer comprising Ta$_2$O$_5$, TiO$_2$, ZrO$_2$, Al$_2$O$_3$, Y$_2$O$_3$, HfSiO$_x$, HfO$_2$, ZrSiO$_x$, TaSiO$_x$, SrO$_x$, SrSiO$_x$, LaO$_x$, LaSiO$_x$, YO$_x$, or YSiO$_x$, or a combination of two or more thereof.

4. The method according to claim 1, wherein the providing comprises providing a substrate comprising Si, Ge, Si/Ge, or GaAs, or a combination of two or more thereof.

5. The method according to claim 1, wherein the creating comprises introducing a process gas into the process chamber to create the plasma.

6. The method according to claim 5, wherein the process gas comprises an inert gas, a reactive gas, or both.

7. The method according to claim 6, wherein the inert gas comprises He, Ne, Ar, Kr, or Xe, or a combination of two or more thereof.

8. The method according to claim 6, wherein the reactive gas comprises HCl, HBr, Cl$_2$, Br$_2$, or C$_x$H$_y$X$_z$, or a combination of two or more thereof, wherein X is a halogen.

9. The method according to claim 1, wherein the exposing the high-k layer to a plasma at least partially removes the high-k layer in an anisotropic etch process.

10. The method according to claim 1, wherein the creating comprises applying RF power through an impedance match network to an upper plate electrode of a plasma source.

11. The method according to claim 10, wherein the RF frequency applied to the upper plate electrode is between about 10 MHz and about 200 MHz.

12. The method according to claim 10, wherein the RF power applied to the upper plate electrode is between about 50 W and about 5,000 W.

13. The method according to claim 1, wherein the creating comprises applying RF power through an impedance match network to an inductive coil of a plasma source.

14. The method according to claim 13, wherein the RF power is inductively coupled to the plasma from the inductive coil through a dielectric window.

15. The method according to claim 13, wherein the RF frequency applied to the inductive coil is between about 0.1 MHz and about 100 MHz.

16. The method according to claim 13, wherein the RF power applied to the inductive coil is between about 50 W and about 10,000 W.

17. The method according to claim 1, wherein the applying comprises applying an RF frequency of between about 0.1 MHz and about 30 MHz to the substrate holder.

18. The method according to claim 1, wherein the applying comprises applying an RF power of between about 10 W and about 500 W to the substrate holder.

19. The method according to claim 1, wherein the applying comprises applying an RF power of between about 20 W and about 100 W to the substrate holder.

20. The method according to claim 1, wherein the creating comprises applying RF power to a rotating DC magnetic field power source.

21. A method for forming a gate stack by etching a portion of a high-k layer that is adjacent to a gate electrode, the method comprising:
providing, on a substrate holder in a process chamber, a gate stack containing a substrate having an interface layer formed on the substrate, a high-k layer formed on the interface layer, and a patterned gate electrode layer formed on the high-k layer such that said portion of the high-k layer is exposed;
selecting an anisotropic plasma etch process for etching the high-k layer;
determining an RF power to apply to the substrate holder during the anisotropic plasma etch process, the predetermined RF power having a characteristic to minimize or prevent a rate of formation of an oxide interface layer located between the substrate and the high-k layer next to the gate stack;
creating a plasma in the process chamber to thereby expose the portion of the high-k layer to the plasma in the anisotropic plasma etch process; and
minimizing or preventing a rate of formation of an oxide interface layer by applying the RF power to the substrate holder while performing the anisotropic plasma etch process to the high-k layer.

22. The method according to claim 21, wherein the providing comprises providing a substrate with an interface layer comprising an oxide layer, a nitride layer, or an oxynitride layer, or a combination of two or more thereof.

23. The method according to claim 21, wherein the providing comprises providing a substrate with a high-k layer comprising $Ta_2O_5$, $TiO_2$, $ZrO_2$, $Al_2O_3$, $Y_2O_3$, $HfSiO_x$, $HfO_2$, $ZrSiO_x$, $TaSiO_x$, $SrO_x$, $SrSiO_x$, $LaO_x$, $LaSiO_x$, $YO_x$, or $YSiO_x$, or a combination of two or more thereof.

24. The method according to claim 21, wherein the providing comprises providing a substrate with a gate electrode layer comprising poly-Si, W, Al, TaN, TaSiN, HfN, HfSiN, TiN, TiSiN, Re, Ru, or SiGe, or a combination of two or more thereof.

25. The method according to claim 21, wherein the providing comprises providing a substrate with a substrate comprising Si, Ge, Si/Ge, or GaAs, or a combination of two or more thereof.

26. The method according to claim 21, wherein the providing comprises providing a substrate with a gate stack further comprising a patterned ARC layer, a patterned hard mask, or a patterned photoresist layer, or a combination of two or more thereof.

27. The method of claim 1, wherein said determining comprises determining said RF power to the substrate holder based on process specifications of said etching process or a material composition of said high-k layer or both these factors.

28. The method of claim 10, further comprising determining another RF power to apply to said upper plate electrode, the another RF power having a characteristic to minimize or prevent the rate of formation of an oxide interface layer located between the substrate and the high-k layer.

29. The method of claim 28 wherein said creating comprises creating a plasma containing an HBr etch gas,
wherein said RF power applied to the substrate holder is approximately 50 Watts, and
said another RF power to said upper plate electrode is approximately 200 Watts.

30. The method of claim 21 wherein said determining comprises determining said RF power to the substrate holder based on process specifications of said etching process or a material composition of said high-k layer or both of these factors.

31. The method of claim 21, wherein the creating comprises applying RF power through an impedance match network to an upper plate electrode of a plasma source.

32. The method of claim 31, further comprising determining another RF power to apply to said upper plate electrode, the another RF power having a characteristic to minimize or prevent the rate of formation of the oxide interface layer located between the substrate and the high-k layer.

33. The method of claim 32 wherein said creating comprises creating a plasma containing an HBr etch gas,
wherein said RF power to said substrate holder is approximately 50 Watts, and
wherein said another RF power to said upper plate electrode is approximately 200 Watts.

34. The method of claim 21, further comprising etching a portion of the oxide interface layer, which is located beneath the etched high-k layer.

35. The method of claim 34 wherein said determining comprises determining a RF power having a characteristic to minimize or prevent a bird's beak from forming in an unetched portion of the oxide interface layer located beneath the gate electrode, and said minimizing or preventing comprises minimizing or preventing a bird's beak from forming in an unetched portion of the oxide interface layer located beneath the gate electrode.

* * * * *